United States Patent
Tanaka et al.

(10) Patent No.: US 8,013,356 B2
(45) Date of Patent: Sep. 6, 2011

(54) SEMICONDUCTOR LIGHT EMITTING DEVICE

(75) Inventors: Taketoshi Tanaka, Kyoto (JP); Kuniyoshi Okamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 208 days.

(21) Appl. No.: 12/239,156

(22) Filed: Sep. 26, 2008

(65) Prior Publication Data

US 2009/0095973 A1    Apr. 16, 2009

(30) Foreign Application Priority Data

Sep. 27, 2007 (JP) .................... 2007-251108

(51) Int. Cl.
*H01L 33/00* (2010.01)
(52) U.S. Cl. ........................................................ 257/99
(58) Field of Classification Search .......... 257/177–182, 257/276, 457, 459, 502, 503, 573, 584, 602, 257/621, 664–677, 688–700, 221, 13, 79–103, 257/918, E51.18–E51.022, E33.001–E33.077, 257/E33.054, E25.028, E25.032; 438/25–28; 250/221; 340/555–557
See application file for complete search history.

(56) References Cited

U.S. PATENT DOCUMENTS

| | | | | |
|---|---|---|---|---|
| 7,541,206 B2 * | 6/2009 | Yoon et al. | ...................... | 438/29 |
| 2002/0056846 A1 * | 5/2002 | Tsuda et al. | .................... | 257/86 |
| 2005/0151153 A1 * | 7/2005 | Kamikawa et al. | ........... | 257/103 |
| 2006/0054907 A1 * | 3/2006 | Lai | .................................. | 257/96 |
| 2006/0094244 A1 * | 5/2006 | Yamada et al. | ............... | 438/700 |
| 2007/0023775 A1 * | 2/2007 | Jang | ................................. | 257/99 |
| 2008/0181275 A1 * | 7/2008 | Matsuyama et al. | ..... | 372/45.011 |
| 2008/0217638 A1 * | 9/2008 | Choi | ............................... | 257/98 |
| 2008/0273562 A1 * | 11/2008 | Hasegawa et al. | ......... | 372/44.01 |
| 2008/0277678 A1 * | 11/2008 | Li et al. | ........................... | 257/94 |
| 2009/0161711 A1 * | 6/2009 | Kubota | ....................... | 372/43.01 |
| 2010/0117056 A1 * | 5/2010 | Nagai | ............................ | 257/13 |

FOREIGN PATENT DOCUMENTS

JP        WO2006123580      * 11/2006

OTHER PUBLICATIONS

Tetsuya Takeuchi et al.: "Theorectical Study of Orientation Dependence of Piezoelectric Effects in Wurtzite Strained GaInN/GaN Heterostructures and Quantum Wells"; Department of Electrical and Electronic Engineering, Meijo University, 1-501 Shiogamaguchi, Tempaku-ku, Nagoya 468-8502, Japan; Jpn. J. Appl. Phys. vol. 39 (2000) pp. 413-416, Part 1, No. 2A, Feb. 2000.

* cited by examiner

*Primary Examiner* — Dao H Nguyen
*Assistant Examiner* — Tram H Nguyen
(74) *Attorney, Agent, or Firm* — Rabin & Berdo, P.C.

(57) ABSTRACT

A semiconductor light emitting device has a device body made of a group III nitride semiconductor having a major surface defined by a nonpolar plane. In the device body, a contact portion with an n-type electrode includes a crystal plane different from the major surface. For example, the contact portion may include a corrugated surface. More specifically, the contact portion may include a region having a plurality of protrusions parallel to a polar plane formed in a striped manner.

13 Claims, 8 Drawing Sheets

SEMICONDUCTOR LIGHT EMITTING DEVICE

BACKGROUND OF THE INVENTION

1. Field of the Invention

The present invention relates to a semiconductor light emitting device (such as a light emitting diode or a laser diode) employing a group III nitride semiconductor.

2. Description of Related Art

Group III nitride semiconductors are group III-V semiconductors employing nitrogen as a group V element, and typical examples thereof include aluminum nitride (AlN), gallium nitride (GaN) and indium nitride (InN), which can be generally expressed as $Al_xIn_yGa_{1-x-y}N$ ($0 \leq x \leq 1$, $0 \leq y \leq 1$ and $0 \leq x+y \leq 1$).

A method of manufacturing a nitride semiconductor by growing a group III nitride semiconductor on a gallium nitride (GaN) substrate having a major surface defined by a c-plane by metal organic chemical vapor deposition (MOCVD) is known in general. This method is so applied that a GaN semiconductor multilayer structure having an n-type layer and a p-type layer can be formed, and a light emitting device can be prepared using such a multilayer structure. Such a light emitting device can be utilized as a light source for a backlight for a liquid crystal panel, for example.

A major surface of a GaN semiconductor regrown on a GaN substrate having a major surface defined by a c-plane is also defined by the c-plane. Light extracted from the c-plane is randomly polarized (unpolarized). When incident upon the liquid crystal panel, therefore, light other than specific polarized light corresponding to an incidence-side polarizing plate is blocked, and does not contribute to brightness to an emission side. Therefore, it is difficult to implement high brightness display (efficiency is 50% at the maximum).

In order to solve this problem, a technique of preparing a light emitting device by growing a GaN semiconductor having a major surface defined by a plane other than the c-plane, i.e., a nonpolar plane such as an a-plane or an m-plane or a semipolar plane is discussed. When a light emitting device having a p-type layered portion and an n-type layered portion is formed by a GaN semiconductor layer having a major surface defined by a nonpolar plane or a semipolar plane, strongly polarized light can be emitted. Therefore, loss on the incidence-side polarizing plate can be reduced by matching a direction of polarization of the light emitting device and a direction of passage polarization of the incidence-side polarizing plate of the liquid crystal panel with each other. Consequently, high brightness display can be implemented.

SUMMARY OF THE INVENTION

Formation of an n-type electrode on a surface (nonpolar plane) of a GaN semiconductor layer having a major surface defined by a nonpolar plane results in Schottky characteristics shown by a curve L0 in FIG. 4. In other words, it is difficult to attain excellent ohmic contact with the nonpolar plane of the GaN semiconductor layer.

Needless to say, a similar problem arises not only in a semiconductor light emitting device employing a GaN semiconductor but also in a semiconductor light emitting device employing another group III nitride semiconductor.

An object of the present invention is to provide a semiconductor light emitting device that has an excellent ohmic contact of n-type electrode with a device body constituted of a group III nitride semiconductor having a major surface defined by a nonpolar plane.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
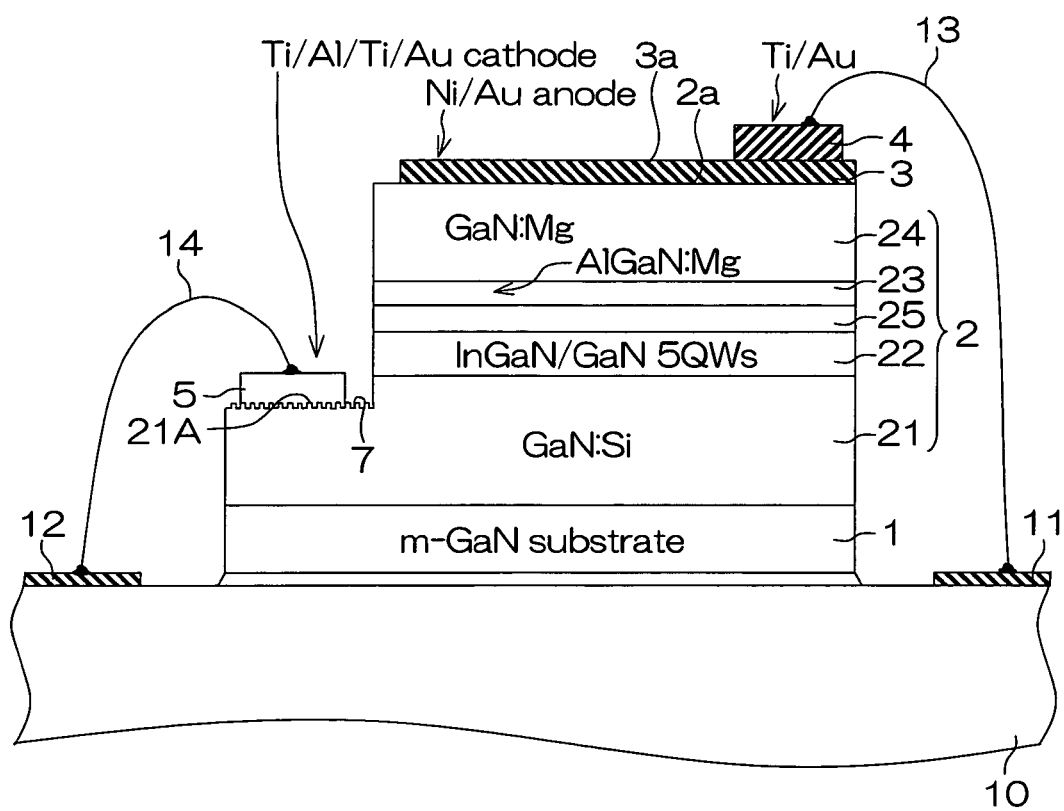
FIG. 1 is a schematic sectional view for illustrating a structure of a light emitting diode according to an embodiment of the present invention.

A semiconductor light emitting device according to an embodiment of the present invention has a device body made of a group III nitride semiconductor having a major surface defined by a nonpolar plane, and a contact portion of the device body with an n-type electrode includes a crystal plane (a polar plane or a semipolar plane) different from the major surface.

According to this structure, the contact portion of the device body, made of the group III nitride semiconductor having the major surface defined by the nonpolar plane, with the n-type electrode includes the crystal plane different from the major surface, i.e., a polar plane or a semipolar plane. The polar or semipolar plane forms excellent ohmic contact with the n-type electrode. Therefore, the n-type electrode can excellently come into ohmic contact with the contact portion of the device body.

The contact portion may have only a nonpolar plane, only a semipolar plane, both of a nonpolar plane and a semipolar plane, a polar plane along with a nonpolar plane, a polar plane along with a semipolar plane, or a nonpolar plane and a semipolar plane as well as a polar plane.

The device body may have a group III nitride semiconductor multilayer structure including an n-type semiconductor layer and a p-type semiconductor layer as well as a light emitting layer (active layer) stacked therebetween.

The device body formed by a group III nitride semiconductor layer having a major surface defined by a nonpolar plane generates remarkably polarized light. When this light emitting device is applied to a light source for a liquid crystal display panel, therefore, a ratio of light not contributing to brightness is reduced, whereby energy efficiency as well as display brightness can be improved.

The group III nitride semiconductor layer having the major surface defined by the nonpolar plane can be formed by growing the group III nitride semiconductor on a group III nitride semiconductor monocrystalline substrate (monocrystalline GaN substrate, for example) having a major surface defined by a nonpolar plane by metal organic chemical vapor deposition. In this case, the group III nitride semiconductor is preferably grown (preferably by not more than 0.1 μm) on the surface of the group III nitride semiconductor monocrystalline substrate (preferably without interposing a buffer layer) by metal organic chemical vapor deposition under such a condition that a ratio (molar ratio) V/III of a nitrogen material to a group III element material (more specifically, a gallium material) is not less than 1000 (not less than 3000, for example) (preferably without employing such a condition that the ratio V/III is less than 1000). According to this method, a (generally dislocation-free) group III nitride semiconductor layer having an extremely small number of dislocations can be so grown that strongly polarized light can be extracted, and the crystallinity of the group III nitride semiconductor is so excellent that high external quantum efficiency can be implemented.

Preferably, the major surface of the group III nitride semiconductor monocrystalline substrate is defined by a nonpolar plane having an offset angle of within ±1° from the plane direction thereof. Thus, a planar dislocation-free group III nitride semiconductor crystal can be more reliably grown.

Preferably, the contact portion includes a corrugated surface. According to this structure, the contact portion includes a crystal plane other than the nonpolar plane due to the corrugated surface. Therefore, excellent ohmic contact can be attained by bringing the n-type electrode into contact with the corrugated surface of the contact portion. Further, the corrugated surface can have a large surface area, whereby the contact area with the n-type electrode can be increased. Thus, more excellent ohmic contact can be formed.

More specifically, the contact portion may include a region having a plurality of protrusions parallel to a polar plane formed in a striped manner.

When the protrusions parallel to the polar plane are formed on the major surface of the group III nitride semiconductor constituting the device body, side faces of the protrusions include polar planes or semipolar planes. Therefore, the n-type electrode can be excellently brought into ohmic contact with the contact portion including the region having the protrusions formed in a striped manner.

The protrusions may be formed on the overall region of the contact portion in a striped manner, or striped protrusions may be formed on a partial region of the contact portion.

Preferably, the protrusions have side faces defined by polar planes. According to this structure, more excellent ohmic contact can be attained due to the protrusions having the side faces defined by the polar planes.

The contact portion may include a region formed by arranging a plurality of protrusions (in a regular arrangement such as a lattice arrangement or in a random arrangement, for example).

When the protrusions are formed on the major surface of the group III nitride semiconductor constituting the device body, the side faces of these protrusions include polar planes or semipolar planes. Therefore, the n-type electrode can be excellently brought into ohmic contact with the contact portion by providing the region formed by arranging the plurality of protrusions on the contact portion.

In this case, the side faces of the protrusions preferably include polar planes. Further, the protrusions preferably include pairs of side faces defined by polar planes respectively. For example, the protrusions may be in the form of rectangular parallelepipeds including pairs of side faces defined by polar planes respectively. According to this structure, the n-type electrode can be excellently brought into ohmic contact with the contact portion of the device body.

The device body may include a conductive group III nitride semiconductor substrate having a major surface defined by a nonpolar plane and a group III nitride semiconductor crystal grown on the surface of the conductive group III nitride semiconductor substrate. In this case, a back surface of the conductive group III nitride semiconductor substrate is preferably employed as a contact portion with the n-type electrode.

According to this structure, the conductive group III nitride semiconductor substrate having the major surface defined by the nonpolar plane is employed such that the device body made of the group III nitride semiconductor crystal having a major surface defined by a nonpolar plane can be prepared by crystal growth on a surface (one major surface) thereof. In this case, the contact portion including a polar plane or a semipolar plane is provided on a back surface (another major surface) of the substrate such that the n-type electrode can be excellently brought into ohmic contact with the back surface of the substrate.

When the back surface of the substrate is ground in order to reduce the thickness of the device, the substrate is so damaged that it is difficult to attain ohmic contact. Such damage is generally removed by mirror finishing represented by CMP (chemical mechanical polishing). If the back surface of the substrate is worked into a mirror surface defined by a nonpolar plane by mirror finishing, however, it is likewise difficult to attain ohmic contact. Therefore, the back surface of the substrate is corrugated after the mirror finishing for exposing a polar plane or a semipolar plane, thereby forming the contact portion, for example. The n-type electrode can be excellently brought into ohmic contact with this contact portion.

The embodiment of the present invention is now described in more detail with reference to the attached drawings.

FIG. 1 is a schematic sectional view for illustrating the structure of a light emitting diode according to an embodiment of the present invention. This light emitting diode has a device body formed by growing a group III nitride semiconductor layer 2 having a group III nitride semiconductor multilayer structure on a GaN (gallium nitride) monocrystalline substrate 1. The group III nitride semiconductor layer 2 is formed by stacking an n-type contact layer 21, a multiple quantum well (MQW) layer 22 as a light emitting layer, a GaN final barrier layer 25, a p-type electron blocking layer 23 and a p-type contact layer 24 successively from a side of the GaN monocrystalline substrate 1. A p-type electrode (anodic electrode) 3 as a transparent electrode is formed on a surface of the p-type contact layer 24, and a connecting portion 4 for wire connection is bonded to a part of the p-type electrode 3. An n-type electrode (cathodic electrode) 5 is bonded to the n-type contact layer 21. Thus, a light emitting diode structure is formed. A part of the n-type contact layer 21 connected with the n-type electrode 5 forms a contact portion 21A in ohmic contact with the n-type electrode 5.

The GaN monocrystalline substrate 1 is bonded to a support substrate (wiring board) 10. Wires 11 and 12 are formed on a surface of the support substrate 10. A bonding wire 13 connects the connecting portion 4 and the wire 11 with each other, while another bonding wire 14 connects the n-type electrode 5 and the wire 12 with each other. The light emitting diode structure and the bonding wires 13 and 14 are sealed with transparent resin (not shown) such as epoxy resin, thereby constituting the light emitting diode.

The n-type contact layer 21 is made of n-type GaN layer containing silicon added thereto as an n-type dopant. The thickness of the n-type contact layer 21 is preferably set to not less than 3 μm. The doping concentration of silicon is set to $10^{18}$ cm$^{-3}$, for example.

The multiple quantum well layer 22 is formed by alternately stacking InGaN layers (quantum well layers: each having a thickness of 3 nm, for example) doped with silicon and GaN layers (barrier layers: each having a thickness of 9 nm, for example) by a prescribed number of cycles (five cycles, for example). The GaN final barrier layer 25 (having a thickness of 40 nm, for example) is stacked between the multiple quantum well layer 22 and the p-type electron blocking layer 23.

The p-type electron blocking layer 23 is made of AlGaN layer containing magnesium added thereto as a p-type dopant. The thickness of the p-type electron blocking layer 23 is 28 nm, for example. The doping concentration of magnesium is set to $3 \times 10^{19}$ cm$^{-3}$, for example.

The p-type contact layer 24 is made of GaN layer containing magnesium added thereto as a p-type dopant in a high concentration. The thickness of the p-type contact layer 24 is 70 nm, for example. The doping concentration of magnesium is set to $10^{20}$ cm$^3$, for example. The surface of the p-type contact layer 24 forms the surface 2a of the group III nitride semiconductor layer 2, and the surface 2a is a mirror surface. The surface 2a is a light extraction-side surface for extracting light generated in the multiple quantum well layer 22.

The p-type electrode 3 is formed by a transparent thin metal layer (having a thickness of not more than 200 Å, for example) constituted of an Ni layer and an Au layer. The surface 2a of the group III nitride semiconductor layer 2 is a mirror surface, and hence a surface 3a (light extraction-side surface) of the p-type electrode 3 formed in contact with the surface 2a is also a mirror surface. Thus, both of the light extraction-side surfaces 2a and 3a of the group III nitride semiconductor layer 2 and the p-type electrode 3 respectively are mirror surfaces, whereby the light generated in the multiple quantum well layer 22 is extracted toward the p-type electrode 3 while the polarization state thereof is hardly influenced.

The n-type electrode 5 is formed by a film constituted of a Ti layer and an Al layer.

The GaN monocrystalline substrate 1 is made of a GaN monocrystalline having a major surface defined by a nonpolar plane (m-plane in this embodiment). More specifically, the major surface of the GaN monocrystalline substrate 1 has an offset angle within ±1° from the plane direction of the nonpolar plane.

Figure 2:
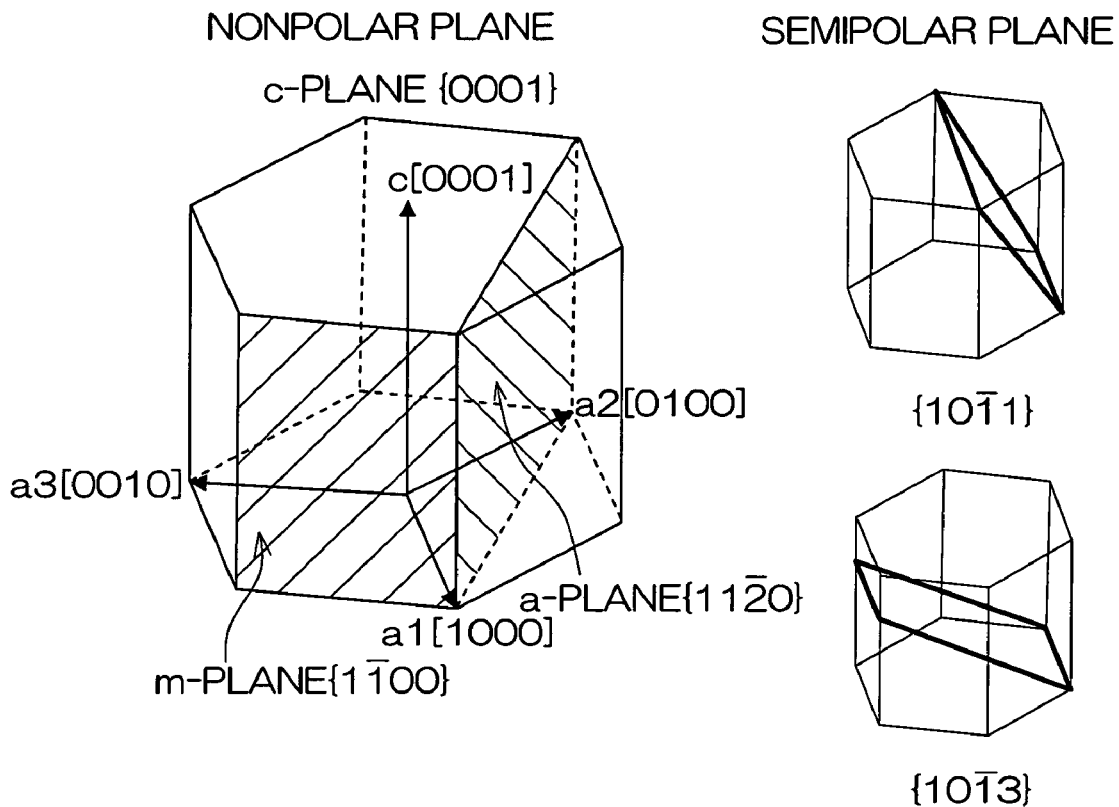
FIG. 2 is a schematic diagram for illustrating a unit cell of a crystal structure of a group III nitride semiconductor.
Figure 2:
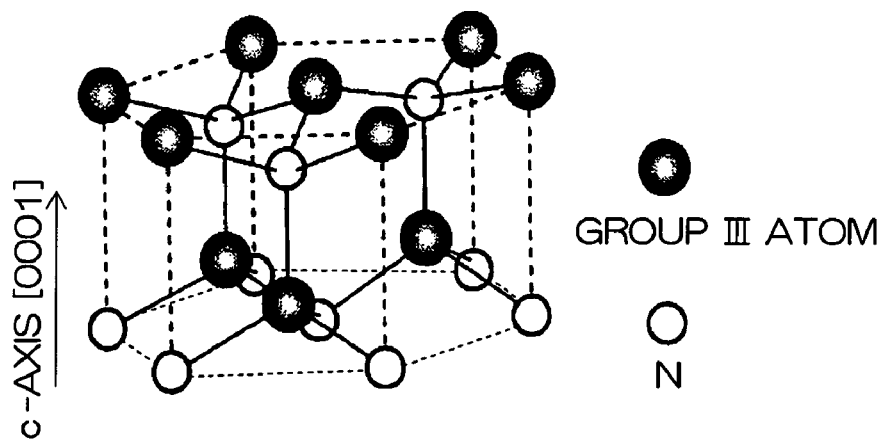

FIG. 2 is a schematic diagram illustrating a unit cell of the crystal structure of the group III nitride semiconductor. The crystal structure of the group III nitride semiconductor can be approximated by a hexagonal system, in which four nitrogen atoms are bonded to each group III atom. The four nitrogen atoms are located on four vertexes of a regular tetrahedron with the group III atom located at the center of regular tetrahedron thereof. One of the four nitrogen atoms is located in a +c-axis direction with respect to the group III atom, while the remaining three nitrogen atoms are located on a −c-axis side with respect to the group III atom. In the group III nitride semiconductor, the direction of polarization is along a c-axis due to this structure.

The c-axis is along an axial direction of a hexagonal prism, and a surface (top face of the hexagonal prism) having the c-axis as a normal is a c-plane (0001). Where the crystal of the group III nitride semiconductor is cleaved along two planes parallel to the c-plane, a +c-axis side (+c-plane) is defined as a crystal plane in which atoms of the group III element are arranged, and a −c-axis side (−c-plane) is defined as a crystal plane in which nitrogen atoms are arranged. Therefore, the c-plane, exhibiting different properties on the +c-axis side and the −c-axis side respectively, is referred to as a polar plane.

The +c-plane and the −c-plane, which are crystal planes different from each other, responsively exhibit different physical properties. More specifically, it has been recognized that the +c-plane has high durability with respect to chemical reactivity such as high resistance to alkali, while the −c-plane is so chemically vulnerable that the same is dissolved in alkali, for example.

On the other hand, each side face of the hexagonal prism is defined by an m-plane (10-10), and a plane passing through a pair of nonadjacent ridges is defined by an a-plane (11-20). These crystal planes, which are perpendicular to the c-plane and orthogonal to the direction of polarization, are polarization-free planes, i.e., nonpolar planes.

Further, crystal planes inclined with respect to (neither parallel not perpendicular to) the c-plane, obliquely intersecting with the direction of polarization, are planes slightly having polarity, i.e., semipolar planes. Specific examples of the semipolar planes include a (10-1-1) plane, a (10-1-3) plane, a (11-22) plane etc.

T. Takeuchi et al., Jap. J. Appl. Phys. 39, 413-416, 2000 discloses the relation between the deviation angle of a crystal plane with respect to the c-plane and the polarization of the crystal plane in the normal direction. Referring to this document, it can be said that the (11-24) plane, the (11-12) plane etc. are also crystal planes having small amounts of polarization, and potentially employable for extracting highly polarized light.

For example, the GaN monocrystalline substrate having the major surface defined by the m-plane can be cut from a GaN monocrystalline having a major surface defined by the c-plane. The m-plane of the substrate thus cut out is polished by chemical mechanical polishing, for example, so that azimuth errors related to both of the (0001) direction and the (11-20) direction are within ±1° (preferably within ±0.3°). Thus, the GaN monocrystalline substrate having the major surface defined by the m-plane is obtained with no crystal defects such as dislocations and stacking defects. The GaN monocrystalline substrate merely has atomic-level steps on its surface.

The light emitting diode (LED) structure is grown on the GaN monocrystalline substrate obtained in this manner by MOCVD.

Figure 3:
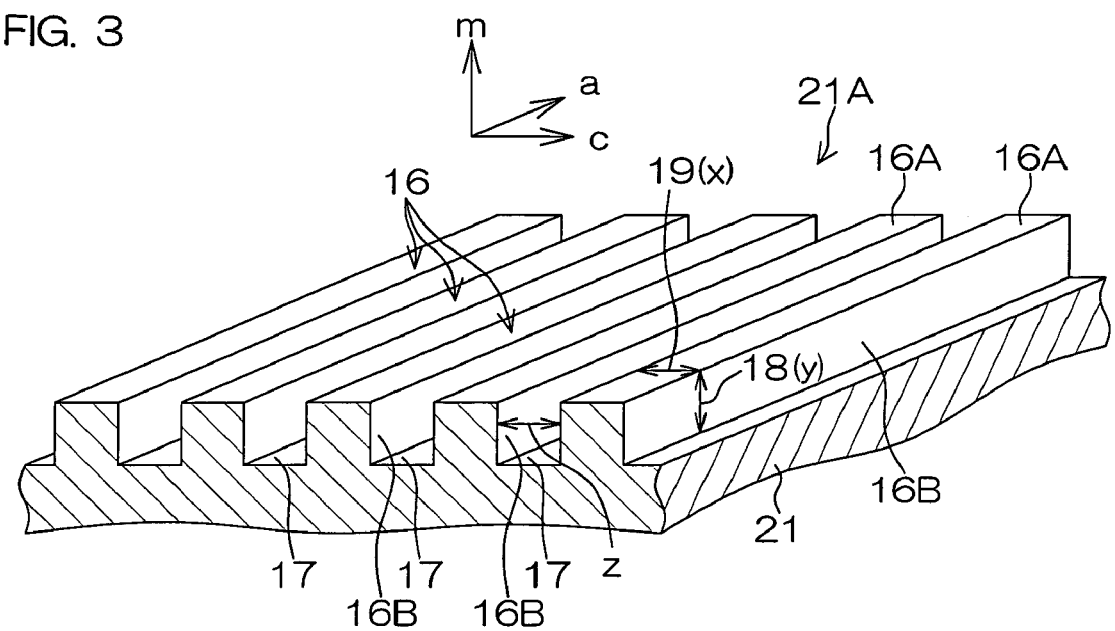
FIG. 3 is a schematic perspective view for illustrating a surface state of a contact portion of an n-type contact layer with respect to an n-type electrode.

FIG. 3 is a schematic perspective view for illustrating the surface state of the contact portion 21A of the n-type contact layer 21. While the contact portion 21A is parallel to the m-plane defining the major growth surface for the n-type contact layer 21 as a whole, a striped corrugated fine structure is formed on the surface thereof. More specifically, a plurality of protrusions 16 are formed in parallel with one another at a prescribed interval, to form the striped structure. Each protrusion 16 has a linear shape parallel to the m-plane and the c-plane (i.e., parallel to the a-axis). According to this embodiment, a section of each protrusion 16 perpendicular to the longitudinal direction is rectangularly formed. A top face 16A of the protrusion 16 is defined by an m-plane, and both of a pair of side faces 16B extending downward from both sides of the top face 16A are defined by c-planes. A groove bottom surface portion 17 between each adjacent pair of protrusions 16 is defined by an m-plane. A height 18 of each protrusion 16 (i.e., the depth of a recess formed between each adjacent pair of protrusions 16) is 2 μm, for example. A width 19 of each protrusion 16 is 2 μm, for example, and the interval between each adjacent pair of protrusions 16 (i.e., the width of the recess formed between each adjacent pair of protrusions) is 1 μm, for example.

The n-type electrode 5 is formed on the contact portion 21A having this corrugated fine structure. In other words, the n-type electrode 5 is in contact with the top faces 16A and the side faces 16B of the protrusions 16 as well as the groove bottom portions 17 between the adjacent protrusions 16.

Figure 4:
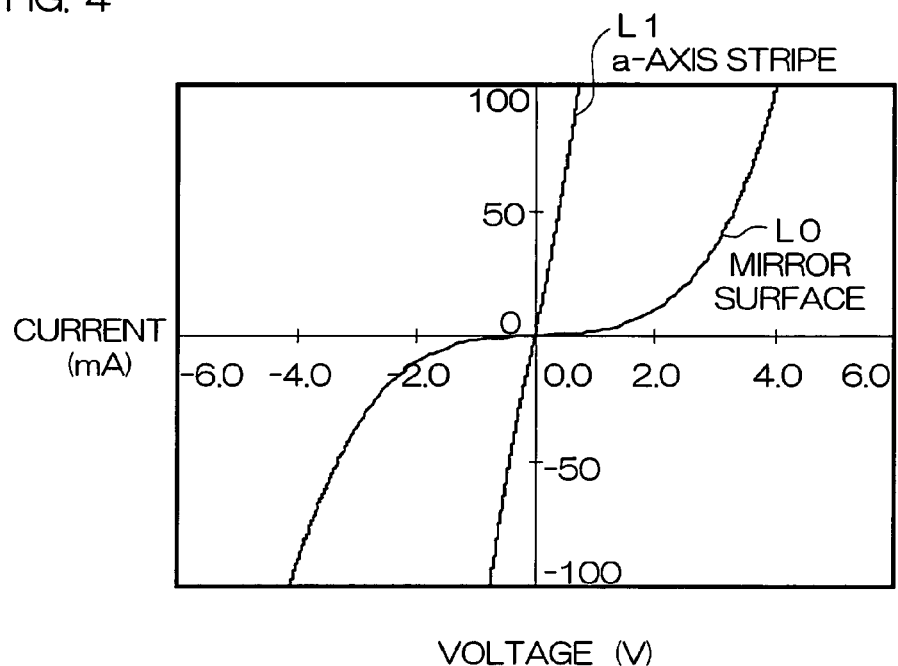
FIG. 4 illustrates the current-voltage characteristics (I-V characteristics) between the n-type contact layer and the n-type electrode.

FIG. 4 illustrates the current-voltage characteristics (I-V characteristics) between the n-type contact layer 21 and the n-type electrode 5. In other words, FIG. 4 shows results obtained by applying voltages of various values between the n-type contact layer 21 and the n-type electrode 5 and measuring currents flowing therebetween. The curve L0 shows I-V characteristics in a case of forming the contact portion 21A of the n-type contact layer 21 by a mirror surface, and the curve L1 shows I-V characteristics in the case of forming the aforementioned corrugated fine structure on the contact portion 21A of the n-type contact layer 21.

When the contact portion 21A is formed by a mirror surface, the surface of the n-type contact layer 21 in contact with the n-type electrode 5 is defined by an m-plane. In this case, the I-V characteristics are not linear as understood from the curve L0, and no ohmic contact can be attained.

When the aforementioned corrugated fine structure is formed on the contact portion 21A, on the other hand, the n-type electrode 5 is in contact with the n-type contact layer 21 on c-planes (both side faces 16B of the protrusions 16), which are crystal planes other than the m-plane. Thus, linear characteristics, i.e., ohmic characteristics unobtainable through junction on the m-plane are obtained, as understood from the curve L1. Further, a larger contact area can be obtained as compared with the case of the mirror surface, and hence contact resistance can be reduced. Thus, excellent ohmic contact can be formed between the n-type electrode 5 and the n-type contact layer 21.

Assuming that x and y represent the width 19 and the height 18 of each protrusion 16 respectively in FIG. 3, the width 19 and the height 18 are preferably set such that the relation $x/y \leq 10$ holds therebetween. If the ratio x/y of the width x to the height y is excessively large (more specifically, greater than 10), the areas of the side faces 16B coming into contact with the n-type electrode 5 are reduced, so that effective contact resistance is increased.

Assuming that z represents the interval between each adjacent pair of protrusions 16 (the width of the recess formed between each adjacent pair of protrusions), the widths x and z of the protrusion 16 and the width of the recess are preferably set such that the $0.1 \leq x/z \leq 10$ holds therebetween. If the ratio x/z is excessively small (less than 0.1) or excessively large (greater than 10), the effective contact area between the n-type electrode 5 and the contact portion 21A (the ratio of the side faces 16B) may be reduced.

If the ratio y/z is excessively large (greater than 2), on the other hand, coverage of the electrode material with respect to the side faces 16B and the groove bottom surface portions 17 may be deteriorated when the n-type electrode 5 is brought into contact therewith by vapor deposition, for example. The coverage of the electrode material depends on the height y of the protrusions 16, and hence the width x and the height y of the protrusions 16 and the interval z between each adjacent pair of protrusions 16 (the width of the recess) are preferably set to proper values.

Figure 5:
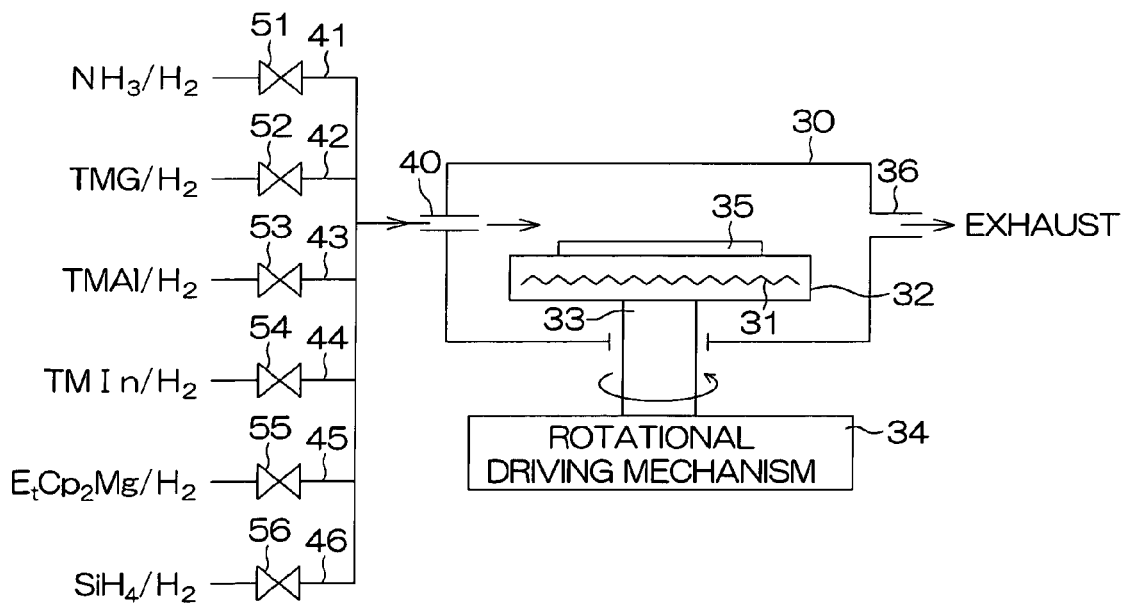
FIG. 5 is a schematic diagram for illustrating the structure of a processing apparatus for growing layers constituting a GaN semiconductor layer.

FIG. 5 is a schematic diagram for illustrating the structure of a processing apparatus for growing layers constituting the group III nitride semiconductor layer 2. A susceptor 32 containing a heater 31 is arranged in a processing chamber 30. The susceptor 32 is coupled to a rotating shaft 33, which is rotated by a rotational driving mechanism 34 arranged outside the processing chamber 30. With this arrangement, the susceptor 32 so holds a wafer 35 to be treated that the wafer 35 can be heated to a prescribed temperature and rotated in the processing chamber 30. The wafer 35 is a GaN monocrystalline wafer constituting the aforementioned GaN monocrystalline substrate 1.

An exhaust pipe 36 is connected to the processing chamber 30. This exhaust pipe 36 is connected to an exhauster such as a rotary pump. Thus, the internal pressure of the processing chamber 30 is set to 1/10 atm. to an ordinary pressure (preferably about 1/5 atm.), and the atmosphere in the processing chamber 30 is regularly exhausted.

On the other hand, a material gas feed passage 40 for feeding material gas toward a surface of the wafer 35 held on the susceptor 32 is introduced into the processing chamber 30. A nitrogen material pipe 41 feeding ammonia as a nitrogen material gas, a gallium material pipe 42 feeding trimethyl gallium (TMG) as a gallium material gas, an aluminum material pipe 43 feeding trimethyl aluminum (TMAl) as an aluminum material gas, an indium material pipe 44 feeding trimethyl indium (TMIn) as an indium material gas, a magnesium material pipe 45 feeding ethylcyclopentadienyl magnesium ($EtCp_2Mg$) as a magnesium material gas and a silicon material pipe 46 feeding silane ($SiH_4$) as a silicon material gas are connected to the processing chamber 30. Valves 51 to 56 are interposed in these material pipes 41 to 46 respectively. Each material gas is fed along with a carrier gas consisting of hydrogen and/or nitrogen.

The GaN monocrystalline wafer having a major surface defined by the m-plane is held on the susceptor 32 as the wafer 35, for example. In this state, the nitrogen material valve 51 is opened while the valves 52 to 56 are kept closed, for feeding the carrier gas and ammonia gas (nitrogen material gas) into the processing chamber 30. Further, the heater 31 is so electrified as to heat the wafer 35 to a temperature of 1000° C. to 1100° C. (1050° C., for example). Thus, the GaN semiconductor can be grown without roughening the surface of the wafer 35.

After the wafer temperature reaches 1000° C. to 1100° C., the nitrogen material valve 51, the gallium material valve 52 and the silicon material valve 56 are opened. Thus, ammonia, trimethyl gallium and silane are fed from the material gas feed passage 40 along with the carrier gas. Consequently, the n-type contact layer 21 made of GaN layer doped with silicon is grown on the surface of the wafer 35.

Then, the silicon material valve 56 is closed, to grow the multiple quantum well layer 22. The multiple quantum well layer 22 can be grown by alternately carrying out the steps of (i) growing the InGaN layers (quantum well layers) by opening the nitrogen material valve 51, the gallium material valve 52 and the indium material valve 54, thereby feeding ammonia, trimethyl gallium and trimethyl indium to the wafer 35, and (ii) growing additive-free GaN layers (barrier layers) by closing the indium material valve 54 and opening the nitrogen material valve 51 and the gallium material valve 52, thereby feeding ammonia and trimethyl gallium to the wafer 35. For example, a GaN layer is formed at first, and an InGaN layer is formed thereon. This step is repetitively carried out five times, and the GaN final barrier layer 25 is finally formed on the uppermost InGaN layer. In the steps of forming the multiple quantum well layer 22 and the GaN final barrier layer 25, a temperature of the wafer 35 is preferably set to 700° C. to 800° C. (730° C., for example), for example.

Then, the p-type electron blocking layer 23 is formed. In other words, the nitrogen material valve 51, the gallium material valve 52, the aluminum material valve 53 and the magnesium material valve 55 are opened, while the remaining valves 54 and 56 are closed. Thus, ammonia, trimethyl gallium, trimethyl aluminum and ethylcyclopentadienyl magnesium are fed toward the wafer 35, to form the p-type electron blocking layer 23 made of AlGaN layer doped with magnesium. In the step of forming the p-type electron blocking layer 23, a temperature of the wafer 35 is preferably set to 1000° C. to 1100° C. (1000° C., for example).

Then, a p-type contact layer 24 is formed. In other words, the nitrogen material valve 51, the gallium material valve 52 and the magnesium material valve 55 are opened, while the remaining valves 53, 54 and 56 are closed. Thus, ammonia, trimethyl gallium and ethylcyclopentadienyl magnesium are fed toward the wafer 35, to form the p-type contact layer 24 made of GaN layer doped with magnesium. In the step of forming the p-type contact layer 24, a temperature of the wafer 35 is preferably set to 1000° C. to 1100° C. (1000° C., for example).

Thus, the group III nitride semiconductor layer 2 is grown on the wafer 35, which in turn is transferred into an etching apparatus, so that recess portions 7 for exposing the n-type contact layer 21 are formed thereon by plasma etching, for example, as shown in FIG. 1. The recess portions 7 may be so formed as to surround the multiple quantum well layer 22, the p-type electron blocking layer 23 and the p-type contact layer 24 in the form of islands, thereby shaping the multiple quantum well layer 22, the p-type electron blocking layer 23 and the p-type contact layer 24 into a mesa structure.

The recess portions 7 present mirror surfaces after the etching. The aforementioned corrugated fine structure is formed on the recess portions 7 by photolithography. More specifically, a striped mask pattern (made of resist, for example) parallel to the c-plane (i.e., parallel to the a-axis) is formed. Etching (dry etching or wet etching) is performed through this striped mask pattern. Thus, the recesses are formed on portions exposed from the striped mask pattern, and the protrusions 16 (see FIG. 3) are formed between the adjacent recesses as a result. The striped mask pattern is removed after the etching. Thus, the contact portion 21A having the striped corrugated fine structure is formed.

Then, the p-type electrode 3, the connecting portion 4 and the n-type electrode 5 are formed by resistive heating or with a metal vapor deposition apparatus employing an electron beam. Thus, the light emitting diode structure shown in FIG. 1 can be obtained. As hereinabove described, the n-type electrode 5 is bonded to the n-type contact layer 21 with a large area on the contact portion 21A, to form excellent ohmic contact with the n-type contact layer 21.

After this wafer process, the wafer 35 is cleaved into each individual device, which in turn is connected to a lead electrode by die bonding and wire bonding, and thereafter sealed in transparent resin such as epoxy resin. The light emitting diode is prepared in this manner.

When each of the layers 21 to 24 constituting the group III nitride semiconductor layer 2 is grown on the wafer 35 (GaN monocrystalline substrate 1), a ratio V/III of the molar fraction of the nitrogen material (ammonia) to that of the gallium material (trimethylgallium) fed to the wafer 35 in the processing chamber 30 is kept at a high level of not less than 3000. According to this embodiment, the group III nitride semiconductor layer 2 having the major surface defined by the m-plane or the like is grown in a dislocation-free state in a planar manner at the high ratio V/III with no buffer layer interposed between the GaN monocrystalline substrate 1 and the group III nitride semiconductor layer 2.

Figure 6:
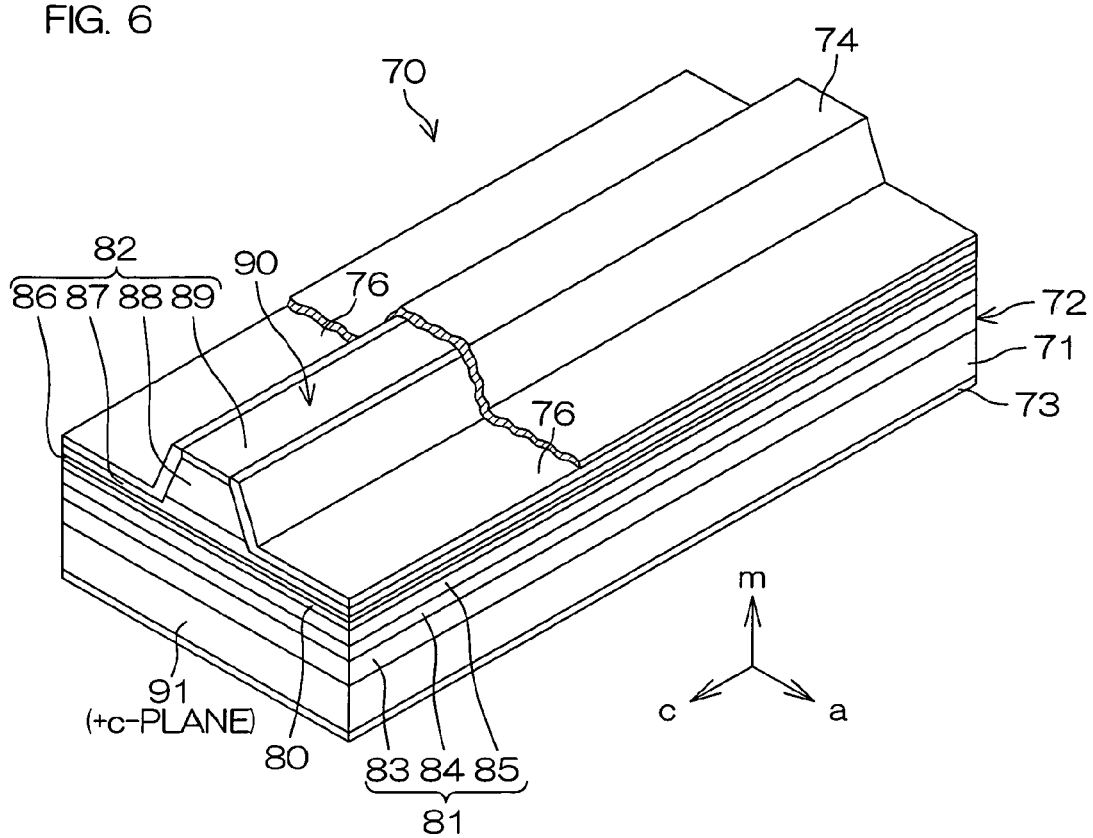
FIG. 6 is a perspective view for illustrating a structure of a semiconductor laser diode which is a light emitting device according to another embodiment of the present invention.
Figure 7:
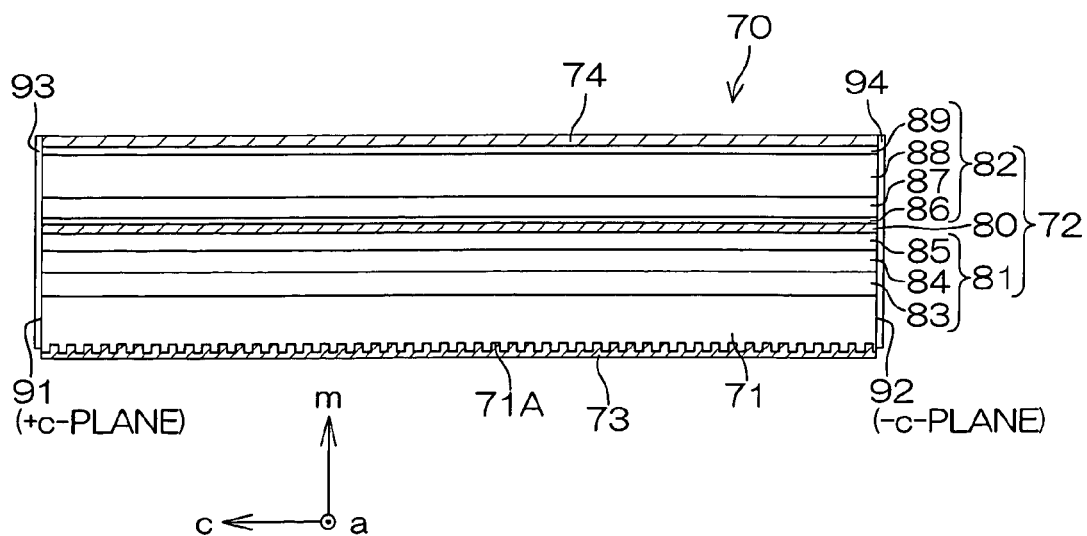
FIG. 7 is a longitudinal sectional view of the semiconductor laser diode shown in FIG. 6.

FIG. 6 is a perspective view for illustrating a structure of a semiconductor laser diode which is a light emitting device according to another embodiment of the present invention, and FIG. 7 is a longitudinal sectional view of the semiconductor laser diode.

This semiconductor laser diode 70 is a Fabry-Perot type semiconductor laser diode having a device body constituted of a conductive substrate 71 and a group III nitride semiconductor multilayer structure 72 formed on the substrate 71 by crystal growth. The semiconductor laser diode 70 further includes an n-type electrode 73 so formed as to come into contact with a back surface of the substrate 71 (a surface of the substrate opposite to the group III nitride semiconductor multilayer structure 72) and a p-type electrode 74 so formed as to come into contact with a surface of the group III nitride semiconductor multilayer structure 72.

According to this embodiment, the substrate 71 is formed by a conductive GaN monocrystalline substrate. More specifically, the substrate 71 is made of n-type GaN doped with Si as an n-type dopant, for example. The major surface of the substrate 71 is defined by an m-plane which is a nonpolar plane, and the group III nitride semiconductor multilayer structure 72 is formed by crystal growth on this major surface. Therefore, the group III nitride semiconductor multilayer structure 72 is made of a group III nitride semiconductor crystal having a major growth surface defined by the m-plane.

The group III nitride semiconductor multilayer structure 72 includes a light emitting layer 80, an n-type semiconductor layer 81 and a p-type semiconductor layer 82. The n-type semiconductor layer 81 is disposed on a side of the light emitting layer 80 closer to the substrate 71, while the p-type semiconductor layer 82 is disposed on a side of the light emitting layer 80 closer to the p-type electrode 74. Thus, the light emitting layer 80 is held between the n-type semiconductor layer 81 and the p-type semiconductor layer 82, whereby a double hetero junction structure is provided. Electrons are injected into the light emitting layer 80 from the n-type semiconductor layer 81, while positive holes are injected there into from the p-type semiconductor layer 82. The electrons and the positive holes are recombined in the light emitting layer 80, to emit light.

The n-type semiconductor layer 81 is formed by successively stacking an n-type GaN contact layer 83 (having a thickness of 2 µm, for example), an n-type AlGaN cladding layer 84 (having a thickness of not more than 1.5 µm such as a thickness of 1.0 µm, for example) and an n-type GaN guide layer 85 (having a thickness of 0.1 µm, for example) from the side closer to the substrate 71. On the other hand, the p-type semiconductor layer 82 is formed by successively stacking a p-type AlGaN electron blocking layer 86 (having a thickness of 20 nm, for example), a p-type GaN guide layer 87 (having a thickness of 0.1 µm, for example), a p-type AlGaN cladding layer 88 (having a thickness of not more than 1.5 µm such as a thickness of 0.4 µm, for example) and a p-type GaN contact layer 89 (having a thickness of 0.3 µm, for example) on the light emitting layer 80.

The n-type GaN contact layer 83 is a low-resistance layer. The p-type GaN contact layer 89 is a low-resistance layer for attaining ohmic contact with the p-type electrode 74. The n-type GaN contact layer 83 is made of an n-type semiconductor prepared by doping GaN with Si, for example, serving as an n-type dopant in a high concentration (the doping concentration is $3 \times 10^{18}$ cm$^{-3}$, for example). The p-type GaN contact layer 89 is made of a p-type semiconductor prepared by doping GaN with Mg serving as a p-type dopant in a high concentration (the doping concentration is $3 \times 10^{19}$ cm$^{-3}$, for example).

The n-type AlGaN cladding layer 84 and the p-type AlGaN cladding layer 88 provide a light confining effect confining the light emitted by the light emitting layer 80 therebetween. The n-type AlGaN cladding layer 84 is made of an n-type semiconductor prepared by doping AlGaN with Si, for example, serving as an n-type dopant (in a doping concentration of $1 \times 10^{18}$ cm$^{-3}$, for example). The p-type AlGaN cladding layer 88 is made of a p-type semiconductor prepared by doping AlGaN with Mg serving as a p-type dopant (in a doping concentration of $1 \times 10^{19}$ cm$^{-3}$, for example). The n-type AlGaN cladding layer 84 has a wider band gap than the n-type GaN guide layer 85, while the p-type AlGaN cladding layer 88 also has a wider band gap than the p-type GaN guide layer 87. Thus, the light can be excellently confined, and a semiconductor laser diode having a low threshold and high efficiency can be implemented.

The n-type GaN guide layer 85 and the p-type GaN guide layer 87 are semiconductor layers providing a carrier confining effect for confining carriers (electrons and positive holes) in the light emitting layer 80. Thus, the efficiency of recombination of the electrons and the positive holes is improved in the light emitting layer 80. The n-type GaN guide layer 85 is made of an n-type semiconductor prepared by doping GaN with Si, for example, serving as an n-type dopant (in a doping concentration of $1 \times 10^{18}$ cm$^{-3}$, for example), while the p-type GaN guide layer 87 is made of a p-type semiconductor prepared by doping GaN with Mg, for example, serving as a p-type dopant (in a doping concentration of $5 \times 10^{18}$ cm$^{-3}$, for example).

The p-type AlGaN electron blocking layer 86 is made of a p-type semiconductor prepared by doping AlGaN with Mg, for example, serving as a p-type dopant (in a doping concentration of $5 \times 10^{18}$ cm$^{-3}$, for example), for preventing the electrons from flowing out of the light emitting layer 80 and improving the efficiency of recombination of the electrons and the positive holes.

The light emitting layer 80, having an MQW (multiple quantum well) structure containing InGaN, for example, is a layer for emitting light by recombination of the electrons and the positive holes and amplifying the emitted light. More specifically, the light emitting layer 80 is formed by alternately repetitively stacking InGaN sublayers (each having a thickness of 3 nm, for example) and GaN sublayers (each having a thickness of 9 nm, for example) by a plurality of cycles. In this case, the In composition ratio of each InGaN layer is set to not less than 5%, so that the InGaN layer has a relatively small band gap and constitutes a quantum well layer. On the other hand, each GaN layer functions as a barrier layer having a relatively large bandgap. The InGaN layers and the GaN layers are alternately repetitively stacked by two to seven cycles, for example, to constitute the light emitting layer 80 having the MQW structure. The emission wavelength is set to 400 nm to 550 nm by controlling the In composition in the quantum well layers (InGaN layers). In the aforementioned MQW structure, the number of the quantum well containing In is preferably set to not more than 3.

The p-type semiconductor layer 82 is partially removed, to form a ridge stripe 90. More specifically, the p-type contact layer 89, the p-type AlGaN cladding layer 88 and the p-type GaN guide layer 87 are partially removed by etching, to form the ridge stripe 90 having a generally trapezoidal cross section. This ridge stripe 90 is formed along the c-axis direction.

The group III nitride semiconductor multilayer structure 72 has a pair of end faces (cleavage planes) 91 and 92 formed by cleavage on both longitudinal ends of the ridge stripe 90. The pair of end faces 91 and 92 are parallel to each other, and both of the end faces 91 and 92 are perpendicular to the c-axis. Thus, the n-type GaN guide layer 85, the light emitting layer 80 and the p-type GaN guide layer 87 constitute a Fabry-Perot cavity having the pair of end faces 91 and 92 as the cavity end faces. In other words, the light emitted in the light emitting layer 80 reciprocates between the cavity end faces 91 and 92, and is amplified by induced emission. Part of the amplified light is extracted from the cavity end faces 91 and 92 as laser beam.

The n-type electrode 73 made of Al metal, for example, and the p-type electrode 74 made of a Pd/Au alloy, for example, are in ohmic contact with the substrate 71 and the p-type contact layer 89 respectively. Insulating layers 76 covering the exposed surfaces of the n-type GaN guide layer 87 and the p-type AlGaN cladding layer 88 are provided such that the p-type electrode 74 is in contact with only the p-type GaN contact layer 89 on the top face of the ridge stripe 90. Thus, a current can be concentrated on the ridge stripe 90, thereby enabling efficient laser oscillation.

The cavity end faces 91 and 92 are covered with insulating films 93 and 94 (not shown in FIG. 6) respectively. The cavity end face 91 is a +c-axis side end face, while the cavity end face 92 is a −c-axis side end face. In other words, the crystal planes of the cavity end faces 91 and 92 are defined by a +c-plane and a −c-plane respectively. The insulating film 94 formed on the −c-plane side can function as a protective film protecting the −c-plane so chemically vulnerable that the same is dissolved in alkali, to contribute to improvement in reliability of the semiconductor laser diode 70.

Figure 8:
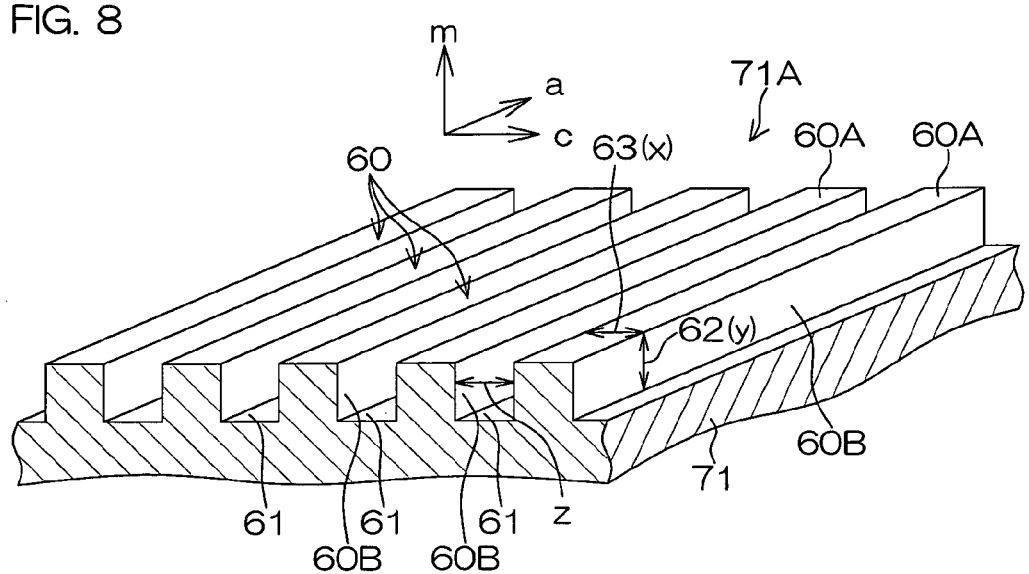
FIG. 8 is a schematic perspective view showing a surface structure of a substrate on a portion in contact with an n-type electrode.

FIG. 8 is a schematic perspective view showing a surface structure of the substrate 71 on a portion connected with the n-type electrode 73. A back surface of the substrate 71 forms a contact portion 71A in contact with the n-type electrode 73. A striped corrugated fine structure is formed on the surface of the contact portion 71A, exposing the m-plane defining the major surface of the substrate 71 as a whole. More specifically, a plurality of protrusions 60 are formed in parallel with one another at a prescribed interval, to constitute the striped structure. Each protrusion 60 has a linear shape parallel to the c-plane (i.e., parallel to the a-axis). According to this embodiment, a section of each protrusion 60 perpendicular to the longitudinal direction is rectangularly formed. A top face 60A of the protrusion 60 is defined by an m-plane, and both of a pair of side faces 60B connected to both sides of the top face 60A respectively are defined by c-planes. A groove bottom surface portion 61 between each adjacent pair of protrusions 60 is defined by an m-plane. The height 62 of each protrusion 60 (i.e., a depth of a recess formed between each adjacent pair of protrusions 60) is 2 µm, for example. The width 63 of each protrusion 60 is 2 µm, for example, and the interval between each adjacent pair of protrusions 60 (i.e., a width of the recess formed between each adjacent pair of protrusions 60) is 1 µm, for example.

The n-type electrode 73 is formed on the contact portion 71A provided with this corrugated fine structure. In other words, the n-type electrode 73 is in contact with the top faces 60A and the side faces 60B of the protrusions 60, as well as the groove bottom surface portions 61 between the adjacent protrusions 60.

According to this structure, linear current-voltage characteristics (I-V characteristics), i.e., ohmic characteristics are obtained between the substrate 71 and the n-type electrode 73, as shown in the curve L1 of FIG. 4. Further, the n-type electrode 73 is in contact with the substrate 71 with a large contact area, to have small contact resistance. Thus, excellent ohmic contact can be formed between the n-type electrode 73 and the substrate 71.

The relation between a width 63 (x) and a height 62 (y) of each protrusion 60 and the interval z between each adjacent pair of protrusions 60 (i.e., a width of the recess formed between each adjacent pair of protrusions) are preferably set similarly to the case of the aforementioned embodiment (see FIG. 3).

Figure 9:
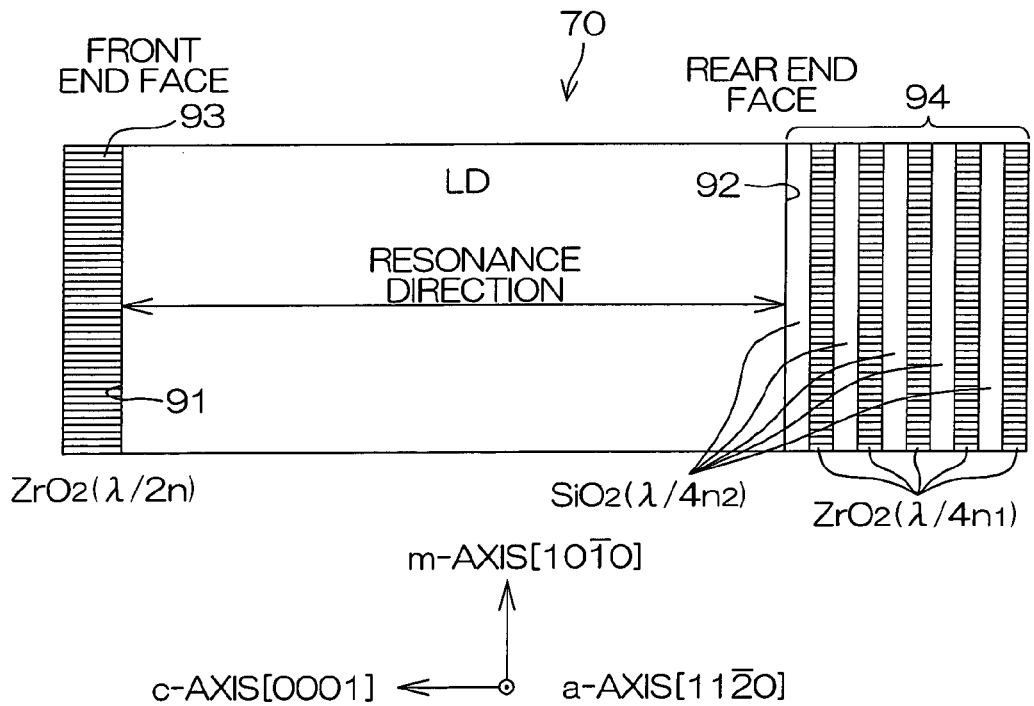
FIG. 9 is a schematic sectional view for illustrating structures of insulating films formed on cavity end faces.

FIG. 9 is a schematic diagram for illustrating the structures of insulating films 93 and 94 formed on the cavity end faces 91 and 92 respectively. The insulating film 93 so formed as to cover the cavity end face 91 which is the +c-plane is constituted of a single layer film of $ZrO_2$, for example. On the other hand, the insulating film 94 formed on the cavity end face 92 which is the −c-plane is constituted of a multi-layer reflective film formed by alternately repetitively stacking $SiO_2$ films and $ZrO_2$ films a plurality of times (five times in the example shown in FIG. 9), for example. The thickness of the $ZrO_2$ single-layer film constituting the insulating film 93 is set to $\lambda/2n_1$ (where $\lambda$ represents the emission wavelength of the light emitting layer 80 and $n_1$ represents the refractive index of $ZrO_2$). On the other hand, the multi-layer reflective film constituting the insulating film 94 is formed by alternately stacking the $SiO_2$ films each having a thickness of $\lambda/4n_2$ (where $n_2$ represents the refractive index of $SiO_2$) and the $ZrO_2$ films each having a thickness of $\lambda/4n_1$.

According to this structure, the +c-axis side end face 91 has small reflectivity, while the −c-axis side end face 92 has large reflectivity. More specifically, the reflectivity of the +c-axis side end face 91 is about 20%, while the reflectivity of the −c-axis side end face 92 is about 99.5% (virtually 100%). Therefore, the +c-axis side end face 91 emits a larger laser output. In other words, the +c-axis side end face 91 serves as a laser emitting end face in this semiconductor laser diode 70.

According to this structure, light having a wavelength of 400 nm to 550 nm can be emitted by connecting the n-type electrode 73 and the p-type electrode 74 to a power source and injecting the electrons and the positive holes into the light emitting layer 80 from the n-type semiconductor layer 81 and the p-type semiconductor layer 82 respectively, thereby recombining the electrons and the positive holes in the light emitting layer 80. This light reciprocates between the cavity end faces 91 and 92 along the guide layers 85 and 87, and is amplified by induced emission. Thus, a larger laser output is extracted from the cavity end face 91 serving as the laser emitting end face.

When the group III nitride semiconductor multilayer structure 72 having the major growth surface defined by the m-plane is grown on the GaN monocrystalline substrate 71 having the major surface defined by the m-plane and a section along the a-plane is observed with an electron microscope (STEM: scanning transmission electron microscope), no striations showing presence of dislocations are observed on the group III nitride semiconductor multilayer structure 72. When the surface state thereof is observed with an optical microscope, it is understood that flatness in the c-axis direction (difference between the heights of rearmost and lowermost portions) is not greater than 10 Å. This indicates that the flatness of the light emitting layer 80, particularly the quantum well layers, in the c-axis direction is not greater than 10 Å, and the half width of the light emission spectrum can be reduced.

Thus, a dislocation-free m-plane group III nitride semiconductor having flat stacking interfaces can be grown. However, an off-angle of the major surface of the GaN monocrystalline substrate 71 is preferably set to within ±1° (more preferably, within ±0.3°). If a GaN semiconductor layer is grown on an m-plane GaN monocrystalline substrate having an off-angle of 2°, for example, a GaN crystal may be grown in such a terraced manner that no flat surface state can be obtained dissimilarly to the case in which the off-angle is within ±1°.

On the GaN monocrystalline substrate 71 having a major surface defined by the m-plane, the group III nitride semiconductor is crystal grown with the major growth surface defined by the m-plane which is a nonpolar plane. If the group III nitride semiconductor is grown on a major surface defined by a c-plane, luminous efficiency in the light emitting layer 80 may be deteriorated due to influence by the polarization in the c-axis direction. When the major crystal growth surface is defined by the m-plane, on the other hand, the polarization in the quantum well layers is suppressed, and the luminous efficiency is increased. Thus, the threshold can be reduced, and the slope efficiency can be improved. Further, current dependency of the emission wavelength is suppressed due to a small amount of polarization, whereby a stable oscillation wavelength can be implemented.

In addition, the major crystal growth surface is defined by the m-plane, so that the group III nitride semiconductor crystal can be extremely stably grown, and that the crystallinity can be more improved as compared with a case of defining the major crystal growth surface by a c-plane or an a-plane. Thus, a high-performance laser diode can be prepared.

The light emitting layer 80 is made of the group III nitride semiconductor grown on the major growth surface defined by the m-plane, whereby the light emitted therefrom is polarized in the a-axis direction, i.e., in the direction parallel to the m-plane, and the traveling direction thereof is along the c-axis in the case of a TE mode. In the semiconductor laser diode 70, therefore, the major crystal growth surface is parallel to the direction of polarization, and the stripe direction, i.e., the direction of a light guide is set parallel to the traveling direction of the light. Thus, oscillation in the TE mode can be easily caused, and a threshold current for causing the laser oscillation can be reduced.

In other words, the major surface for the crystal growth is so defined by the m-plane as to cause physical anisotropy between the c-axis direction and the a-axis direction. Further, the light emitting layer 80 containing In has a quantum well band structure different from that in the case of defining the major crystal growth surface by the c-plane due to biaxial stress resulting from lattice strain. Consequently, a gain different from that in the case of the group III nitride semiconductor having the major crystal growth surface defined by the c-plane is obtained, whereby laser characteristics can be improved.

According to this embodiment, the GaN monocrystalline substrate is used as the substrate 71, so that the group III nitride semiconductor multilayer structure 72 has a higher crystal quality with little defects. Consequently, a high-performance laser diode can be implemented.

Further, the group III nitride semiconductor multilayer structure is grown on the generally dislocation-free GaN monocrystalline substrate, whereby the group III nitride semiconductor multilayer structure 72 is composed of excellent crystal free from layering defects and threading dislocation attributable to the regrowth surface (m-plane) of the substrate 71. Thus, characteristic deterioration such as reduction of the luminous efficiency resulting from the defects can be suppressed.

The respective layers constituting the group III nitride semiconductor multilayer structure 72 can be grown through the aforementioned processing apparatus having the structure shown in FIG. 5.

For example, a GaN monocrystalline wafer having a major surface defined by an m-plane is held as the wafer 35 on the susceptor 32 as the wafer 35. In this state, the nitrogen material valve 51 is opened while the valves 52 to 56 are kept closed, for feeding carrier gas and ammonia gas (nitrogen material gas) into the processing chamber 30. Further, the heater 31 is so electrified as to heat the wafer 35 to 1000° C. to 1100° C. (1050° C., for example). Thus, the GaN semiconductor can be grown without roughening the surface of the wafer 35.

After the wafer temperature reaches 1000° C. to 1100° C., the nitrogen material valve 51, the gallium material valve 52 and the silicon material valve 56 are opened. Thus, ammonia, trimethyl gallium and silane are fed from the material gas feed passage 40 along with the carrier gas. Consequently, the n-type GaN contact layer 83 made of GaN layer doped with silicon is grown on the surface of the wafer 35.

Then, the aluminum material valve 53 is opened, in addition to the nitrogen material valve 51, the gallium material valve 52 and the silicon material valve 56. Thus, ammonia, trimethyl gallium, silane and trimethyl aluminum are fed from the material gas feed passage 40 along with the carrier gas. Consequently, the n-type AlGaN cladding layer 84 is epitaxially grown on the n-type GaN contact layer 83.

Then, the aluminum material valve 53 is closed, while the nitrogen material valve 51, the gallium material valve 52 and the silicon material valve 56 are opened. Thus, ammonia, trimethyl gallium and silane are fed from the material gas feed passage 40 along with the carrier gas. Consequently, the n-type GaN guide layer 85 is epitaxially grown on the n-type AlGaN cladding layer 84.

Then, the silicon material valve 56 is closed, to grow the light emitting layer 80 (active layer) having the multiple quantum well structure. The light emitting layer 80 can be grown by alternately carrying out the steps of (i) growing the InGaN layers (quantum well layers) by opening the nitrogen material valve 51, the gallium material valve 52 and the indium material valve 54, thereby feeding ammonia, trimethyl gallium and trimethyl indium to the wafer 35, and (ii) growing additive-free GaN layers (barrier layers) by closing the indium material valve 54 and opening the nitrogen material valve 51 and the gallium material valve 52, thereby feeding ammonia and trimethyl gallium to the wafer 35. For example, a GaN layer is formed at first, and an InGaN layer is formed thereon. This step is repetitively carried out five times, for example. In the step of forming the light emitting layer 80, the temperature of the wafer 35 is preferably set to 700° C. to 800° C. (730° C., for example), for example. At this time, the growth pressure is preferably set to not less than 700 torr, so that heat resistance can be improved.

Then, the p-type electron blocking layer 86 is formed. In other words, the nitrogen material valve 51, the gallium material valve 52, the aluminum material valve 53 and the magnesium material valve 55 are opened, while the remaining valves 54 and 56 are closed. Thus, ammonia, trimethyl gallium, trimethyl aluminum and ethylcyclopentadienyl magnesium are fed toward the wafer 35, to form the p-type electron blocking layer 86 made of AlGaN layer doped with magnesium. In the step of forming the p-type electron blocking layer 86, a temperature of the wafer 35 is preferably set to 1000° C. to 1100° C. (1000° C., for example).

Then, the aluminum material valve 53 is closed, while the nitrogen material valve 51, the gallium material valve 52 and the magnesium material valve 55 are opened. Thus, ammonia, trimethyl gallium and ethylcyclopentadienyl magnesium are fed toward the wafer 35, to form the guide layer 87 made of p-type GaN layer doped with magnesium. In the step of forming the p-type GaN guide layer 87, a temperature of the wafer 35 is preferably set to 900° C. to 1100° C. (1000° C., for example).

Then, the aluminum material valve 53 is opened again. In other words, the nitrogen material valve 51, the gallium material valve 52, the aluminum material valve 53 and the magnesium material valve 55 are opened, while the remaining valves 54 and 56 are closed. Thus, ammonia, trimethyl gallium, trimethyl aluminum and ethylcyclopentadienyl magnesium are fed toward the wafer 35, to form the cladding layer 88 made of p-type AlGaN layer doped with magnesium. In the step of forming the p-type AlGaN cladding layer 88, a temperature of the wafer 35 is preferably set to 900° C. to 1100° C. (1000° C., for example).

Then, the p-type contact layer 89 is formed. In other words, the nitrogen material valve 51, the gallium material valve 52 and the magnesium material valve 55 are opened, while the remaining valves 53, 54 and 56 are closed. Thus, ammonia, trimethyl gallium and ethylcyclopentadienyl magnesium are fed toward the wafer 35, to form the p-type GaN contact layer 89 made of GaN layer doped with magnesium. In the step of forming the p-type GaN contact layer 89, a temperature of the wafer 35 is preferably set to 900° C. to 1100° C. (1000° C., for example).

The respective layers constituting the p-type semiconductor layer 82 are preferably crystal-grown at an average growth temperature of not less than 1000° C. Thus, heat damage to the light emitting layer 80 can be reduced.

When each of the layers 80 and 83 to 89 constituting the group III nitride semiconductor multilayer structure 72 is grown on the wafer 35 (GaN monocrystalline substrate 71), the ratio V/III of the molar fraction of the nitrogen material (ammonia) to the molar fraction of the gallium material (trimethyl gallium) fed to the wafer 35 in the processing chamber 30 is kept at a high level of not less than 1000 (preferably not less than 3000). More specifically, the average value of the ratio V/III is preferably not less than 1000 from the n-type cladding layer 84 up to the uppermost p-type contact layer 89. Thus, an excellent crystal having a small number of point defects in all of the n-type cladding layer 84, the light emitting layer 80 and the p-type cladding layer 88 can be obtained.

According to this embodiment, the group III nitride semiconductor multilayer structure 72 having the major surface defined by the m-plane or the like is grown in the dislocation-free state in the planar manner at the aforementioned high ratio V/III with no buffer layer interposed between the GaN monocrystalline substrate 71 and the group III nitride semiconductor multilayer structure 72. This group III nitride semiconductor multilayer structure 72 has neither stacking faults nor threading dislocations arising from the major surface of the GaN monocrystalline substrate 71.

Thus, the group III nitride semiconductor multilayer structure 72 is grown on the wafer 35, which in turn is transferred into an etching apparatus in order to form the ridge stripe 90 by partially removing the p-type semiconductor layer 82 through dry etching such as plasma etching, for example. This ridge stripe 90 is so formed as to be parallel to the c-axis direction.

After the formation of the ridge stripe 90, insulating layers 76 are formed. The formation of insulating layers 76 are achieved through a lift-off step, for example. In other words, the insulating layers 76 can be formed by forming a striped mask, thereafter forming a thin insulator film to entirely cover the p-type AlGaN cladding layer 88 and the p-type GaN contact layer 89 and thereafter lifting off the thin insulator film thereby exposing the p-type GaN contact layer 89.

Then, back surface grinding is performed for reducing the thickness of the substrate 71. The substrate 71 has a thickness of 300 μm in an initial stage, for example, and this thickness of the substrate 71 is reduced to about 80 μm. The back surface of the substrate 71 is damaged due to the back surface grinding. In order to remove this damage from the damaged layer, back surface polishing is performed after the back surface grinding. For example, the back surface of the substrate 71 is polished into a mirror surface by CMP (chemical mechanical polishing).

The aforementioned corrugated fine structure is formed by performing photolithography and etching on the mirror-finished back surface of the substrate 71. More specifically, a striped mask pattern (made of resist, for example) parallel to the c-plane (i.e., parallel to the a-axis) is formed. Etching (dry etching or wet etching) is performed using this striped mask pattern. Thus, the recesses are formed on portions exposed from the striped mask pattern, and the protrusions 60 (see FIG. 8) are formed between the adjacent recesses as a result. The striped mask pattern is removed after the etching. Thus, the contact portion 71A having the striped corrugated fine structure is formed.

Then, the p-type electrode 74 is formed in ohmic contact with the p-type GaN contact layer 89, and the contact portion 71A (back surface of the substrate 71) is formed in ohmic contact with n-type electrode 3. These electrodes 73 and 74 can be formed by resistive heating or with a metal vapor deposition apparatus employing an electron beam, for example.

In the next step, the wafer 35 is divided into each individual device. In other words, each device constituting the semiconductor laser diode is cut by cleaving the wafer 35 in the directions parallel to and perpendicular to the striped p-type electrode 74 respectively. In relation to the direction parallel to the striped p-type electrode 74, the wafer 35 is cleaved along the a-plane. In relation to the direction perpendicular to the striped p-type electrode 74, on the other hand, the wafer 35 is cleaved along the c-plane. Thus, the cavity end faces 91 and 92 defined by the +c-plane and the −c-plane respectively are formed.

Then, the aforementioned insulating films 93 and 94 are formed on the cavity end faces 91 and 92 respectively. These insulating films 93 and 94 can be formed by electron cyclotron resonance (ECR) film formation, for example.

Figure 10:
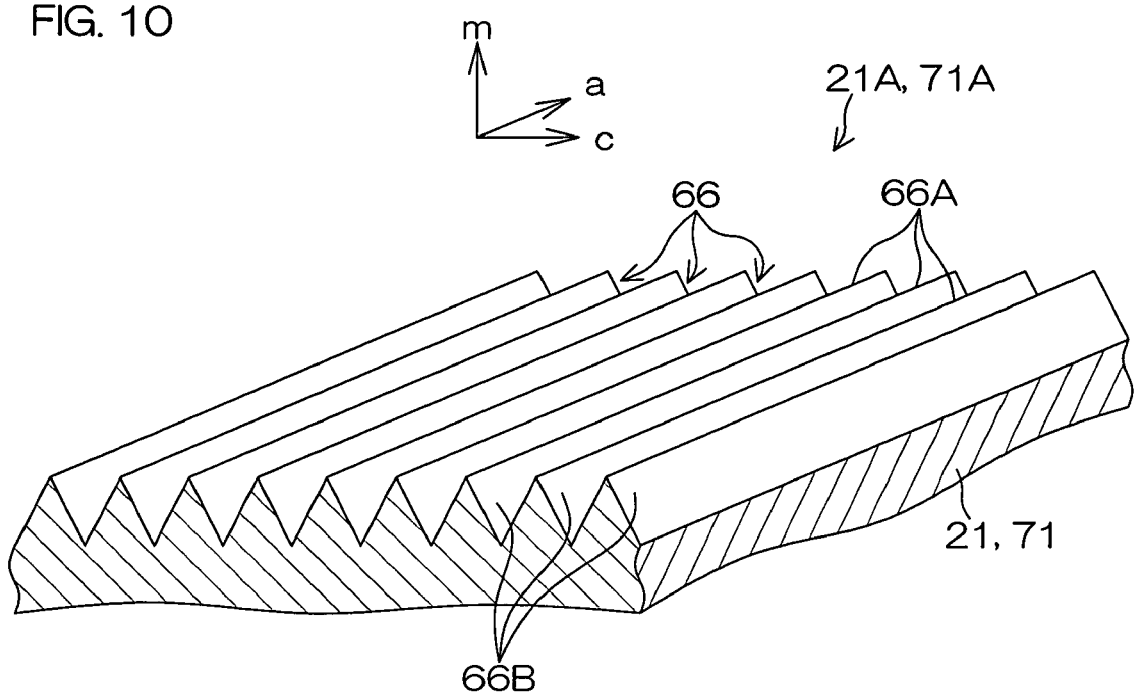
FIG. 10 is a schematic sectional view showing another example of a corrugated fine structure to be formed on a contact portion with respect to the n-type electrode.

FIG. 10 is a schematic perspective view showing another example of the corrugated fine structure to be formed on the contact portion 21A or 71A. According to this example, a plurality of protrusions 66 parallel to the m-plane and the c-plane (i.e., parallel to the a-axis) are formed to constitute a striped pattern. Each protrusion 66 has a linear shape parallel to the c-plane, and a section thereof perpendicular to the longitudinal direction is in the form of a triangle (isosceles triangle in this example). Therefore, a pair of side faces 66B inclined with respect to the m-plane are formed on both sides of a ridge 66A of each protrusion 66, and a crystal plane of each side face 66B is defined by a semipolar plane inclined with respect to both of the m-plane (nonpolar plane) and the c-plane (polar plane).

Therefore, the n-type electrode 5 or 73 is bonded to the n-type contact layer 21 or the substrate 71 on the semipolar plane which is a crystal plane other than the nonpolar plane, and has a large contact area. Thus, excellent ohmic contact can be formed.

The contact portion 21A or 71A having this structure can be formed by photolithography and etching.

Figure 11:
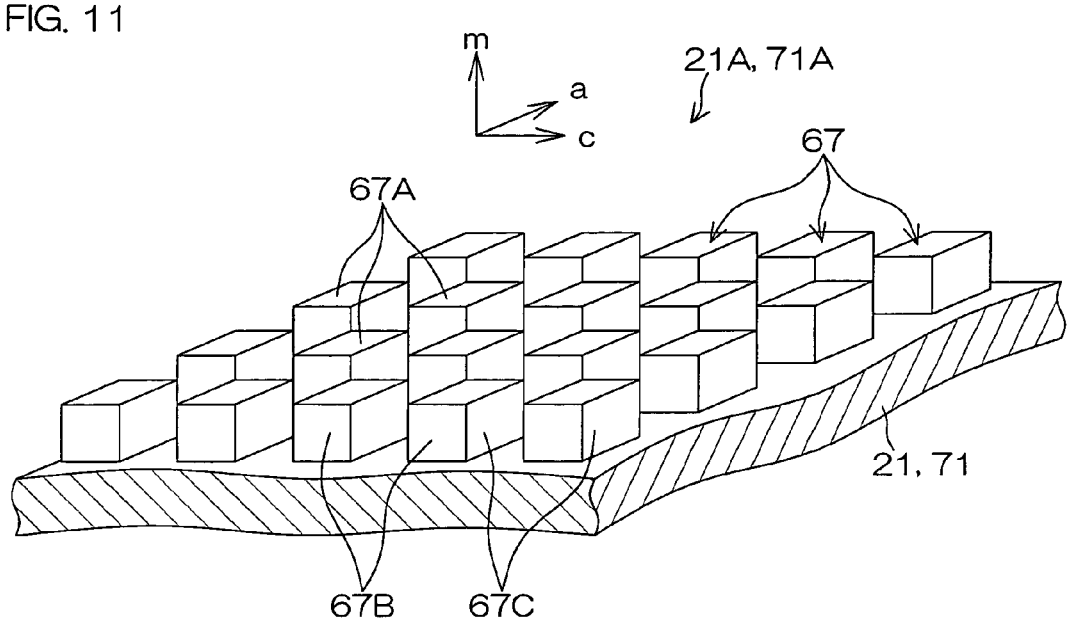
FIG. 11 is a schematic sectional view showing still another example of the corrugated fine structure to be formed on the contact portion with respect to the n-type electrode.

FIG. 11 is a schematic perspective view showing still another example of the corrugated fine structure to be formed on the contact portion 21A or 71A. According to this example, a plurality of block-shaped protrusions 67 in the form of rectangular parallelepipeds are arranged in the form of a lattice along the c-axis direction and the a-axis direction. Each protrusion 67 has a rectangular top face 67A and four side faces 67B and 67C connected to the top face 67A. The top face 67A is defined by an m-plane, the pair of side faces 67B parallel to each other are defined by a-planes, and another pair of side faces 67C parallel to each other are defined by c-planes.

Therefore, the n-type electrode 5 or 73 is bonded to the n-type contact layer 21 or the substrate 71 on the contact portion 21A or 71A including c-planes (side faces 67C) which are crystal planes other than nonpolar planes, and has a large contact area. Thus, excellent ohmic contact can be formed.

The contact portion 21A or 71A having this structure can also be formed by photolithography and etching.

Figure 12:
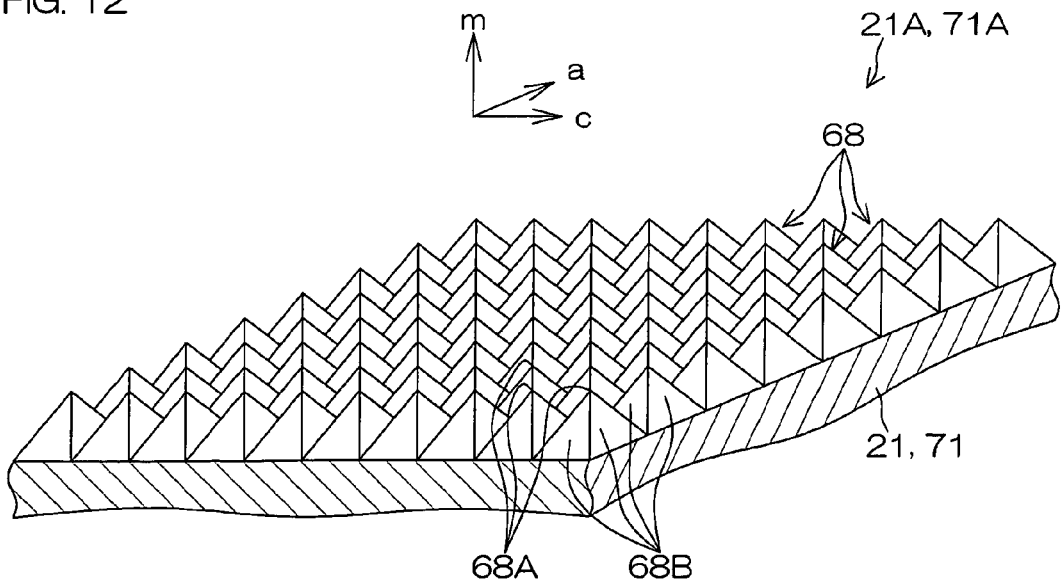
FIG. 12 is a schematic sectional view showing a further example of the corrugated fine structure to be formed on the contact portion with respect to the n-type electrode.

FIG. 12 is a schematic perspective view showing a further example of the corrugated fine structure to be formed on the contact portion 21A or 71A. According to this example, a plurality of block-shaped protrusions 68 in the form of pyramids are arranged in the form of a lattice along the c-axis direction and the a-axis direction. Each protrusion 68 has four side faces 68B radially spreading from a vertex 68A. A crystal plane of each side face 68B is defined by a semipolar plane inclined with respect to both of the m-plane (nonpolar plane) and the c-plane (polar plane).

Therefore, the n-type electrode 5 or 73 is bonded to the n-type contact layer 21 or the substrate 71 on the semipolar plane which is a crystal plane other than the nonpolar plane, and has a large contact area. Thus, excellent ohmic contact can be formed.

The contact portion 21A or 71A having this structure can be formed by photolithography and etching.

While the embodiments of the present invention have been described, the present invention can be carried out also in other modes. For example, the corrugated fine structure of the contact portion 21A or 71A is not restricted to the above. More specifically, the striped corrugated structure may alternatively be formed along a direction inclined with respect to both of the c-plane and the a-plane (direction neither parallel nor perpendicular to both of the c-plane and the a-plane). In this case, the side faces of the protrusions forming the striped pattern are defined by semipolar planes. When the plurality of block-shaped protrusions are formed, the arrangement direction thereof may not be along the c-axis or the a-axis, but the protrusions may be in a random arrangement. In addition, the protrusions are not restricted to the shapes of rectangular parallelepipeds or four-sided pyramid, but may arbitrarily be shaped into triangular pyramids or conical trapezoids. Needless to say, the corrugated fine structure can be prepared by forming recesses in place of the protrusions. Further, the corrugated fine structure may not be regularly formed, but the surface of the contact portion 21A or 71A may be roughened to expose a crystal plane other than the m-plane, for bonding the n-type electrode 5 or 73 thereto.

While the aforementioned embodiments are applied to the light emitting diode and the semiconductor laser diode each including the group III nitride semiconductor multilayer structure having the major growth surface defined by the m-plane which is a nonpolar plane, the diode structure or the laser structure may alternatively be formed by a group III nitride semiconductor multilayer structure having a major growth surface defined by an a-plane which is another nonpolar plane.

While the recess portions 7 are formed for exposing the n-type contact layer 21 and the contact portion 21A having the corrugated fine structure is formed on the exposed portions of the n-type contact layer 21 in the embodiment shown in FIG. 1, the structure of the semiconductor laser diode 70 shown in FIG. 6 may also be employed. In other words, a conductive GaN substrate may be so employed as to form the corrugated fine structure on a contact portion provided on the back surface of the conductive GaN substrate (surface opposite to the group III nitride semiconductor layer) as the contact portion with the n-type electrode 5. In this case, the recess portions 7 for exposing the n-type contact layer 21 may not be formed.

In the embodiment shown in FIG. 6, the substrate 71 may be removed by laser lift-off or the like after the formation of the group III nitride semiconductor multilayer structure 72, so that the semiconductor laser diode has no substrate 71. In this case, the corrugated fine structure may be formed on the surface of the n-type semiconductor layer 81 as the contact portion with the n-type electrode 73.

While the GaN semiconductor is employed as the group III nitride semiconductor in each of the aforementioned embodiments, the present invention is also applicable to a light emitting device employing another group III nitride semiconductor expressed as $Al_xIn_yGa_{1-x-y}N$.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-251108 filed in the Japanese Patent Office on Sep. 27, 2007, the disclosure of which is incorporated herein by reference in its entirety.

What is claimed is:

1. A semiconductor light emitting device having:
   a device body made of a group III nitride semiconductor, the device body including
   an n-type semiconductor layer, a p-type semiconductor layer, and a light emitting layer stacked between the n-type semiconductor layer and the p-type semiconductor layer,
   the device body being located on a conductive substrate, wherein the conductive substrate has a major surface defined by a nonpolar plane, and a contact portion of the device body with an n-type electrode includes a crystal plane different from the major surface, wherein the contact portion includes a corrugated surface, and the corrugated surface includes a top surface defined by an m-plane and a side surface defined by a polar plane.

2. The semiconductor light emitting device according to claim 1, wherein the contact portion includes a region having a plurality of protrusions parallel to a polar plane formed in a striped manner.

3. The semiconductor light emitting device according to claim 2, wherein the protrusions have side faces defined by polar planes.

4. The semiconductor light emitting device according to claim 2, wherein sections of the protrusions perpendicular to the longitudinal direction are rectangularly formed, each of the protrusions has a top face defined by a nonpolar plane and a pair of parallel side faces extending downward from both sides of the top face, and the pair of side faces are defined by polar planes.

5. The semiconductor light emitting device according to claim 2, wherein the n-type electrode is in contact with the top face, the pair of side faces, and a groove bottom surface of the contact portion between each adjacent pair of the protrusions.

6. The semiconductor light emitting device according to claim 4, further including a recess formed between each adjacent pair of the protrusions, wherein
   a width x of each protrusion and a depth y of the recess satisfy $x/y \leq 10$.

7. The semiconductor light emitting device according to claim 4, further including a recess formed between each adjacent pair of the protrusions, wherein
   a width x of each protrusion and a width z of the recess satisfy $0.1 \leq x/z \leq 10$.

8. The semiconductor light emitting device according to claim 4, further including a recess formed between each adjacent pair of the protrusions, wherein
   a depth y and a width z of the recess satisfy $y/z \leq 2$.

9. The semiconductor light emitting device according to claim 4, further including a recess formed between each adjacent pair of the protrusions, wherein
   a width x of each protrusion and a depth y of the recess satisfy $x/y \leq 10$, the width x of each the protrusion and a width z of the recess satisfy $0.1 \leq x/z \leq 10$, and the depth y and the width z of the recess satisfy $y/z \leq 2$.

10. The semiconductor light emitting device according to claim 1, wherein the contact portion includes a region formed by arranging a plurality of protrusions.

11. The semiconductor light emitting device according to claim 10, wherein the protrusions include block-shaped protrusions in a form of rectangular parallelepiped.

12. The semiconductor light emitting device according to claim 11, wherein each of the block-shaped protrusions has a rectangular top face and four side faces connected to the top face, and a parallel pair of the side faces are defined by polar planes.

13. The semiconductor light emitting device according to claim 1, wherein
   the device body includes a conductive group III nitride semiconductor substrate having a major surface defined by a nonpolar plane and a group III nitride semiconductor crystal grown on the surface of the conductive group III nitride semiconductor substrate, and
   a back surface of the conductive group III nitride semiconductor substrate is employed as the contact portion with the n-type electrode.

* * * * *